United States Patent [19]

Terui et al.

[11] 4,267,515
[45] May 12, 1981

[54] DISTORTION FACTOR METER CIRCUIT

[75] Inventors: Nobuo Terui, Kodaira; Kozo Kobayashi, Higashimurayama, both of Japan

[73] Assignee: Nakamichi Research Inc., Tokyo, Japan

[21] Appl. No.: 8,880

[22] Filed: Feb. 2, 1979

[30] Foreign Application Priority Data

Feb. 16, 1978 [JP] Japan .................................. 53-16900

[51] Int. Cl.³ .............................................. H03K 5/24
[52] U.S. Cl. .................................... 328/147; 328/148; 328/149; 328/163; 324/76 A; 307/358
[58] Field of Search .............. 328/146, 147, 148, 149, 328/163; 307/358, 265; 324/76 A

[56] References Cited

U.S. PATENT DOCUMENTS

| | | | |
|---|---|---|---|
| 3,800,167 | 3/1974 | Smith | 307/265 |
| 3,883,756 | 5/1975 | Dragon | 307/265 |
| 4,071,781 | 1/1978 | Kayalioglu | 328/147 |
| 4,175,256 | 11/1979 | Dolikian | 328/149 |

*Primary Examiner*—John S. Heyman
*Attorney, Agent, or Firm*—Pearne, Gordon, Sessions, McCoy & Granger

[57] ABSTRACT

This invention relates to a distortion factor meter circuit adapted to measure a harmonic distortion factor of a signal, particularly. A first transmission line is provided which is adapted to shape a first signal having a harmonic component to produce a DC signal, to convert the DC signal into a square wave having a width proportional to the level of the input DC signal and a predetermined periodicity, and thereafter to produce a triangular wave signal having a level linearly increasing from a zero level during the existence of the level of the input square wave signal and linearly decreasing immediately after the level of the square wave signal disappears. A second transmission line is also provided which is adapted to produce a second signal having a residual harmonic component left by eliminating a fundamental from the first signal. Further, a voltage comparator is provided which serves to produce a digital signal of "1" when the level of the output signal from the first transmission line is lower than that from the second transmission line, and to produce a digital signal of "0" when the level of the output signal from the first transmission line is higher than that from the second transmission line. Finally, an integration circuit is provided which serves to integrate the output signal from the voltage comparator.

4 Claims, 4 Drawing Figures

DISTORTION FACTOR METER CIRCUIT

BACKGROUND OF THE INVENTION

The distortion factor meter or indicator indicates the ratio of the amplitude of a harmonic component after eliminating a fundamental therefrom, to the amplitude of our original signal to be measured. The meter should be corrected so as to adjust the level of the signal to be measured to the reference point on the scale of the indicator when the distortion factor is measured by the indicator. However, this level correction results in the troublesome operation.

There has been proposed a method for treating a signal to be measured, by control means such as an automatic gain control circuit (AGC circuit) after the amplification of the signal to be measured, so as to automatically correct the level of the input signal. This method, however, cannot precisely measure the distortion factor because an additional distortion having no relation to the original signal to be measured is added to the original distortion due to the AGC circuit.

A method has been proposed which is adapted to measure the analogue values of a distortion component and an input signal wave component by means of an analogue multiplier. This method can eliminate the affect from the AGC circuit as well as the troublesome level correction. The analogue multiplier of the prior art has not only a complicated and expensive construction, but also a poor linearity which causes the error of the indication. In addition thereto, it has a narrow dynamic range, and as a result, a poor reliability.

SUMMARY OF THE INVENTION

Accordingly, it is a principal object of the invention to provide a distortion factor meter circuit adapted to perform an operation of a signal so as to produce an output signal without any variation in its level even though an input signal varies in its level.

It is another object of the invention to provide a distortion factor meter which is not required to be precisely corrected so as to adjust the level of a signal to be measured to the reference point on the scale of the meter.

It is another object of the invention to provide a distortion factor meter circuit which can be stably operated.

It is another object of the invention to provide a signal divider system adapted to have a wide dynamic range, a better property and a reliability.

It is another object of the invention to provide a distortion factor meter circuit adapted to have a simple and inexpensive construction.

In accordance with the invention, there is provided a distortion factor meter circuit comprising a first transmission line including means to shape a first signal having a harmonic component into a DC signal; means to convert said DC signal into a square wave signal having a width proportional to the level of said DC signal and a predetermined periodicity; and means to convert said square wave signal into a triangular wave signal having a level linearly increasing during the existence of the level of said square wave signal and linearly decreasing after the level of said square wave signal disappears; and a second transmission line including means to produce a second signal having a residual harmonic component left by eliminating a fundamental from said first signal; a voltage comparator to compare the output signal of said first transmission line with that of said second transmission line so as to produce a digital signal of "1" when the level of the output signal of said first transmission line is lower than that of said second transmission line and a digital signal of "0" when the level of the output signal of said first transmission line is higher than that of said second transmission line; and means to integrate the output signal of said voltage comparator.

BRIEF DESCRIPTION OF THE DRAWING

The above and other objects and features of the invention will be apparent from the description of an embodiment taken with reference to the accompanying drawing in which.

DETAILED DESCRIPTION OF THE EMBODIMENT

Figure 1:
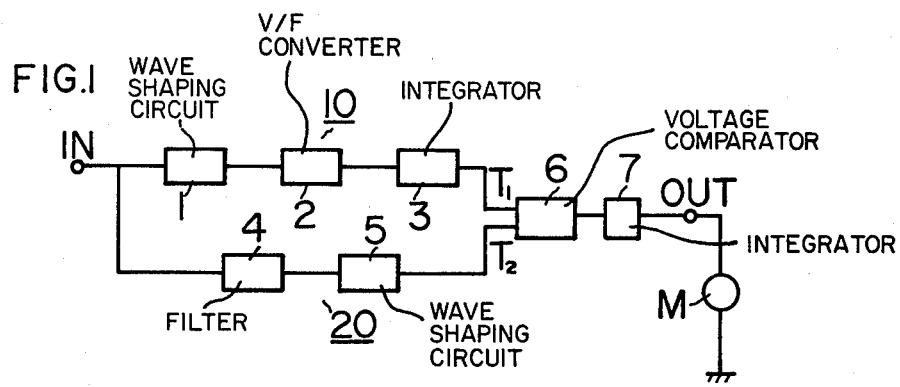
FIG. 1 is a schematic diagram of a distortion factor meter circuit of the invention.

FIG. 1 shows a distortion factor meter circuit constructed in accordance with the invention. The distortion factor meter circuit comprises a first transmission line 10 and a second transmission line 20.

Figure 2A:
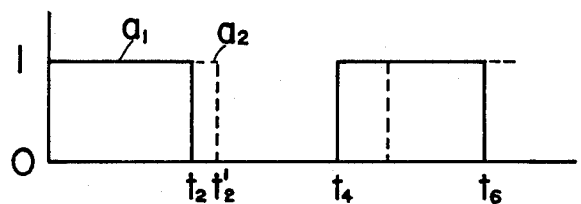
FIG. 2a illustrates an output signal wave of a voltage-frequency converter.
Figure 2B:
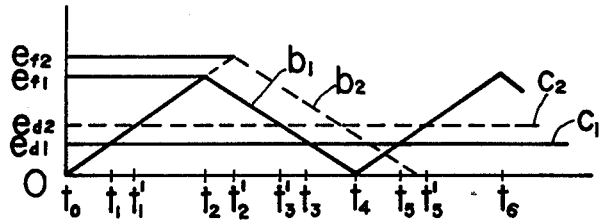
FIG. 2b illustrates output signal waves of an integrator and a rectifier, respectively.

The first transmission line 10 includes a wave shaping circuit 1 which serves to shape a signal wave to be measured as a first signal and input to an input terminal IN, into a DC signal having a level of an absolute value. This may be accomplished by rectifying the signal to be measured or by integrating it after its rectification. The first transmission line 10 also includes a voltage-frequency converter 2 which serves to convert the input DC signal from the wave shaping circuit 1 into a square wave or pulse signal $a_1$ having a width proportional to the level of the DC signal and a predetermined periodicity or periodical frequency as shown in FIG. 2a. The first transmission line 10 also includes an integration circuit 3 which serves to convert the square wave signal input from the voltage-frequency converter 2 into a triangular wave signal $b_1$ as shown in FIG. 2b. The triangular wave signal $b_1$ has a level linearly increasing from a zero level during the existence of the level of the square wave signal and linearly decreasing to the zero level after the square wave signal disappears. This triangular wave signal $b_1$ is applied to an input terminal $T_1$ of a voltage comparator 6.

The second transmission line 20 includes a filter 4 such as a high pass filter or a band elimination filter which serves to eliminate a fundamental wave component from the first signal which is to be measured and is input to the input terminal IN to produce a harmonic component at the output thereof. The second transmission line 20 also includes a wave shaping circuit 5 which serves to shape the harmonic component into a distortion DC signal $c_1$ having a level of an absolute value as shown in FIG. 2b. This may be accomplished by rectifying the harmonic component or by integrating the harmonic component after its rectification. The distortion DC signal is applied to another input terminal $T_2$ of the voltage comparator 6.

Figure 2C:
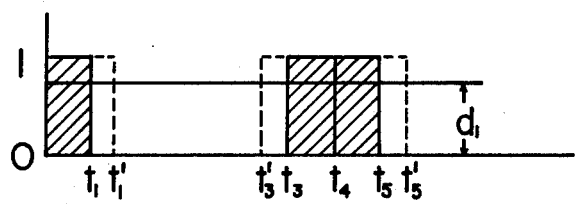
FIG. 2c illustrates an output signal wave of a voltage comparator.

The voltage comparator 6 serves to compare the output signal or triangular wave signal $b_1$ at the output of the first transmission line 10 with the output signal or distortion DC signal $c_1$ at the output of the second transmission line 20. More particularly, if the level of the triangular wave signal $b_1$ at the output of the first transmission line 10 is lower than that of the distortion DC signal $c_1$ at the output of the second transmission line 20, then a digital signal of "1" appears at the output of the voltage comparator 6. If the former is higher than the latter, then a digital signal of "0" appears at the output of the voltage comparator 6. FIG. 2c shows the digital signals at the output of the voltage comparator 6.

Thus, as shown in FIG. 2, since the output signal of the first transmission line 10 has a level of 0 at a time of $t_0$, the digital signal at the output of the voltage comparator 6 exhibits the status of "1" which continues until $t_1$. As time lapses, the level of the triangular wave signal at the output of the first transmission line 10 gradually increases, and at time of $t_1$ becomes equal to the level $ed_1$ of the distortion DC signal $c_1$ at the output of the second transmission line 20, with the result that the digital signal at the output of the voltage comparator 6 changes from the status of "1" to "0". The status of "0" of the digital signal at the output of the voltage comparator 6 continues from time of $t_1$ to $t_3$, during which the level of the triangular wave signal linearly increases until it reaches the highest level of $ef_1$ at time of $t_2$ and thereafter linearly decreases until it again reaches the level of $ed_1$ at time of $t_3$. Since the level of the triangular signal at the output of the first transmission line 10 is lower than that of the distortion DC signal $c_1$ at the output of the second transmission line 20 at a time of $t_3$, the digital signal at the output of the voltage comparator 6 changes from the status of "0" to "1", which continues until time of $t_5$. During this, the triangular wave signal at the output of the first transmission line 10 linearly decreases to the level of zero and then linearly increases to the level of $ed_1$ at time of $t_5$. In this manner, a series of pulses appear at the output of the voltage comparator 6, corresponding to the level of the distortion DC signal $c_1$ at the output of the second transmission line 20.

An integration circuit 7 is provided in series to the voltage comparator 6 and serves to integrate these pulses to produce an output signal having a level of $d_1$ (FIG. 2c) at an output terminal OUT of the integration circuit 7. This level of $d_1$ corresponds to the ratio of the distortion DC signal $c_1$ at the output of the second transmission line 20 to the triangular wave signal $b_1$ at the first transmission line 10.

An indicating device M may be provided in series to the integration circuit 7 and indicates the ratio of the harmonic component to the signal to be measured. If the input signal to be measured changes in its level so that the square wave signal at the output of the voltage-frequency converter 2 becomes $a_2$ as indicated in FIG. 2a, then the triangular wave signal at the output of the integration circuit 3 becomes $b_2$ as shown in FIG. 2b in which its highest level becomes $ef_2$. It should be noted that the varied triangular wave signal has an upwardly inclined wave line extending from the uppermost point in a linear manner and a downwardly inclined wave line parallel to that of the triangular wave signal $b_1$. It should be also noted that the distortion DC signal increases in proportion to the increasing ratio of the input signal to be measured. Thus, it will be noted that the ratio of time $t'_2$ at which the level of the triangular wave signal $b_2$ becomes highest to time $t'_1$ at which this level reaches $ed_2$ which corresponds to the level of the distortion DC signal $c_2$ is equal to that of period $t_2$ to $t_1$ which corresponds to the period ratio in the unchanged level of the input signal to be measured. This is true in case of the downwardly inclined line of the triangular wave signal. It should be noted that this means the digital signal at the output of the voltage comparator 6 becomes unchanged even though the level of the input signal to be measured varies, which causes the level correction to be unnecessary. It will be understood that in case of a constant level of the input signal to be measured and its harmonic component having a varied level, the varied ratio of the level of the distortion DC signal to that of the input signal to be measured appears at the output terminal OUT.

As noted from the embodiment, the simple construction causes the system to be more inexpensive. In fact, its cost can be as one-tenth as that of the prior system using an analogue-multiplier. The voltage-frequency converter 2 and the integration circuit 3 may be in the form of an integrated component, which causes its operation to be stably and precisely effected. It will be noted that the integration circuit 3 permits the positively linear triangular wave signal $b_1$ or $b_2$ to be more easily obtained, which provides a wide dynamic range, a better property and a reliability of the system.

While one embodiment of the invention has been illustrated and described with reference to the accompanying drawing, it will be understood by those skilled in the art that it is by way of example, and that various changes and modifications may be made without departing from the spirit and scope of the invention, which is intended to be defined only to the appended claims.

What is claimed is:

1. A distortion factor meter circuit comprising a first transmission line including means to shape a first signal having a harmonic component into a first DC signal, means to convert said first DC signal into a square wave signal having a width proportional to the level of said DC signal and a predetermined periodicity, and means to convert said square wave signal into a triangular wave signal having a level linearly increasing during the existence of the level of said square wave signal and linearly decreasing after the level of said square wave signal disappears; a second transmission line including means to produce a second signal formed by eliminating a fundamental from said first signal and means to shape said second signal into a second DC signal; a voltage comparator to compare the output signal of said first transmission line with that of said second transmission line so as to produce a digital signal of "1" when the level of the output signal of said first transmission line is lower than that of said second transmission line and a digital signal of "0" when the level of the output signal of said first transmission line is higher than that of said second transmission line; and means to integrate the output signal of said voltage comparator.

2. A distortion factor meter circuit as set forth in claim 1, and wherein said means to convert said first DC signal into a square wave signal is a voltage-frequency converter.

3. A distortion factor meter circuit as set forth in claim 1, and wherein said means to convert said square wave signal is an integration circuit.

4. A distortion factor meter circuit as set forth in claim 1, and wherein said means to convert said DC signal into a square wave signal is a voltage-frequency converter while said means to convert said square wave signal into a triangular wave signal is an integration circuit, said voltage-frequency converter and said integration circuit being combined in the form of integrated components.

* * * * *